(12) United States Patent
Lee et al.

(10) Patent No.: US 7,670,904 B2
(45) Date of Patent: Mar. 2, 2010

(54) NONVOLATILE MEMORY DEVICE AND METHOD FOR FABRICATING THE SAME

(75) Inventors: Woon-Kyung Lee, Seongnam-si (KR); Jong-Kwang Lim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 342 days.

(21) Appl. No.: 11/651,538

(22) Filed: Jan. 10, 2007

(65) Prior Publication Data

US 2008/0081414 A1   Apr. 3, 2008

(30) Foreign Application Priority Data

Oct. 2, 2006   (KR) ...................... 10-2006-0097331

(51) Int. Cl.
*H01L 21/336* (2006.01)

(52) U.S. Cl. ...................... 438/257; 438/259

(58) Field of Classification Search ................ 438/190, 438/195, 198, 257, 259
See application file for complete search history.

(56) References Cited

U.S. PATENT DOCUMENTS

2006/0234447 A1* 10/2006 Choi et al. .................. 438/257

FOREIGN PATENT DOCUMENTS

| JP | 11-097560 | 4/1999 |
|----|-----------|--------|
| JP | 2001-035942 | 2/2001 |
| JP | 2005-183769 | 7/2005 |
| KR | 1020010061395 A | 7/2001 |
| KR | 1020040025242 A | 3/2004 |
| KR | 1020040067597 A | 7/2004 |
| KR | 1020060054576 A | 5/2006 |

* cited by examiner

*Primary Examiner*—Thanh V. Pham
*Assistant Examiner*—Marvin Payen
(74) *Attorney, Agent, or Firm*—Volentine & Whitt, PLLC

(57) ABSTRACT

A method for fabricating a nonvolatile memory device comprises providing a substrate, forming an insulating layer and a conductive layer on the substrate, forming an electrical connection path out of a portion of the conductive layer, through which the conductive layer is electrically connected to the substrate, and gate patterning the insulating layer and the conductive layer.

11 Claims, 19 Drawing Sheets

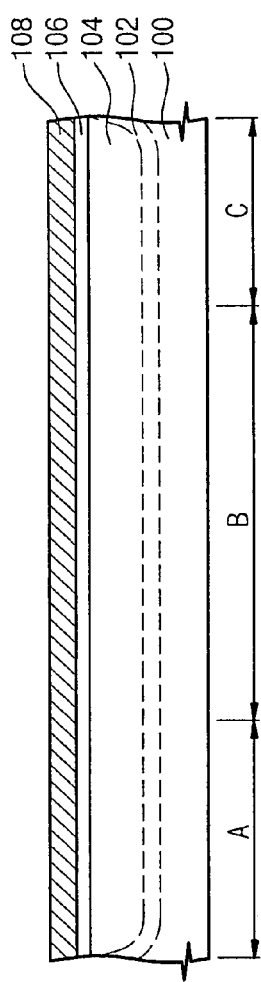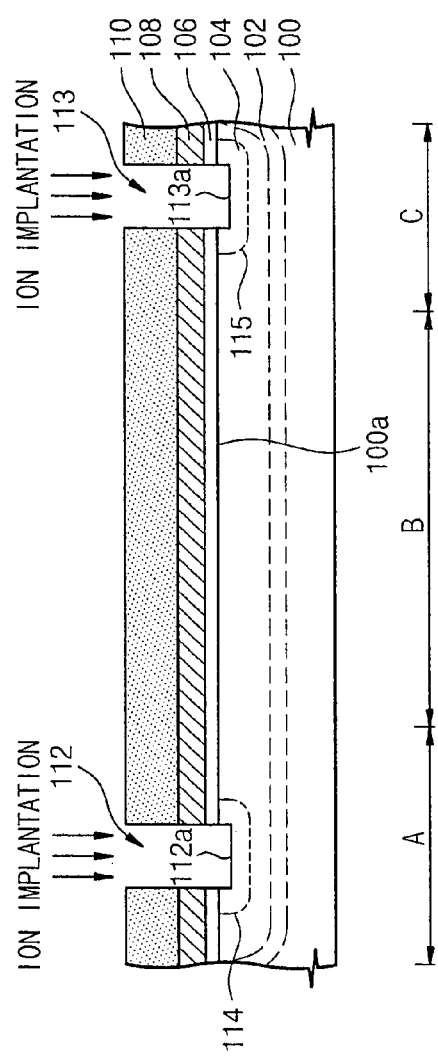

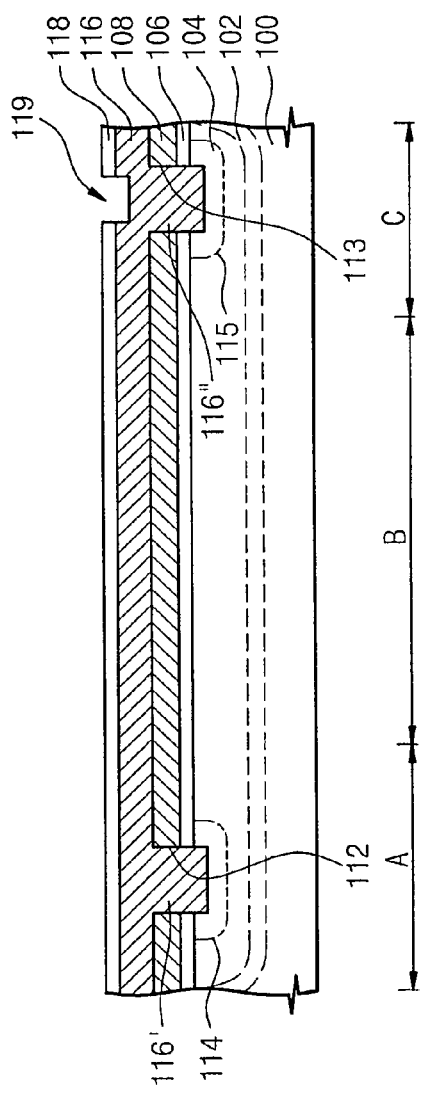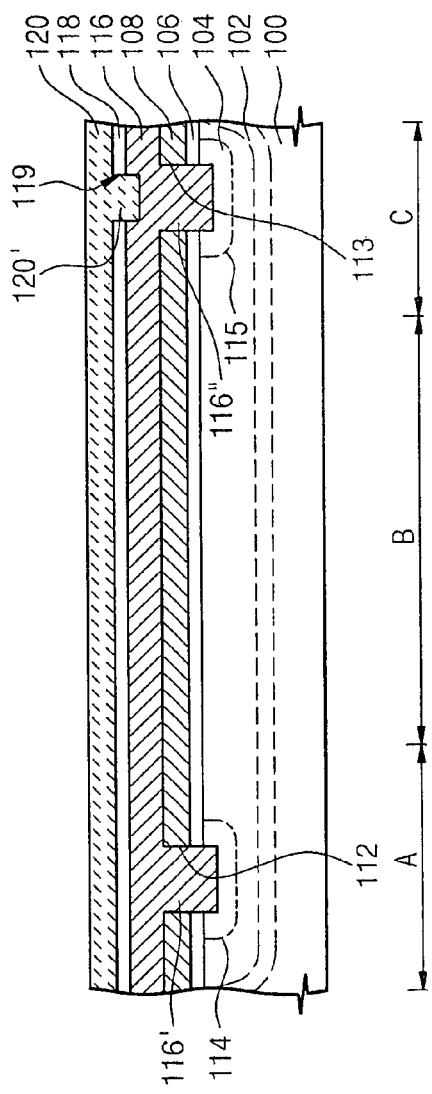

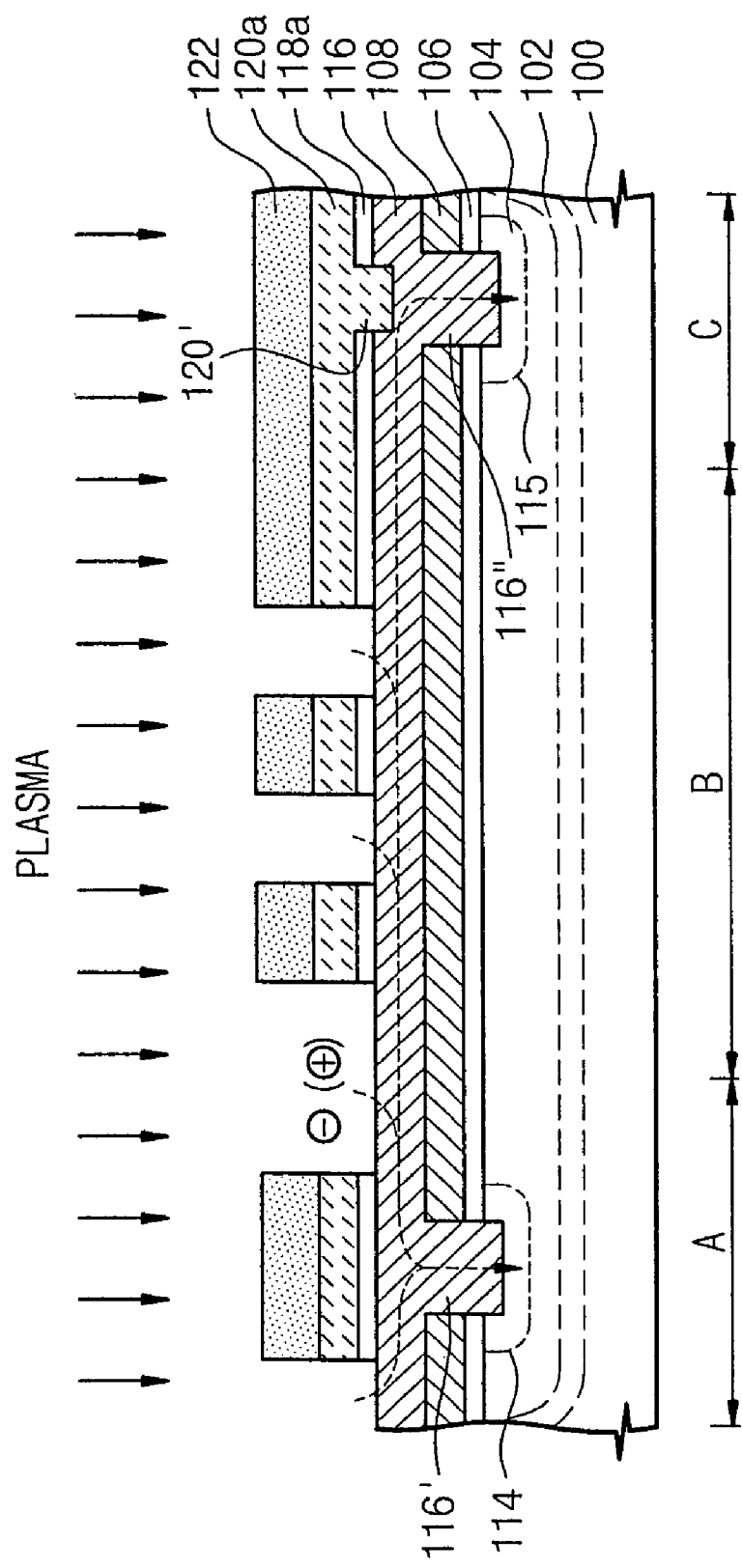

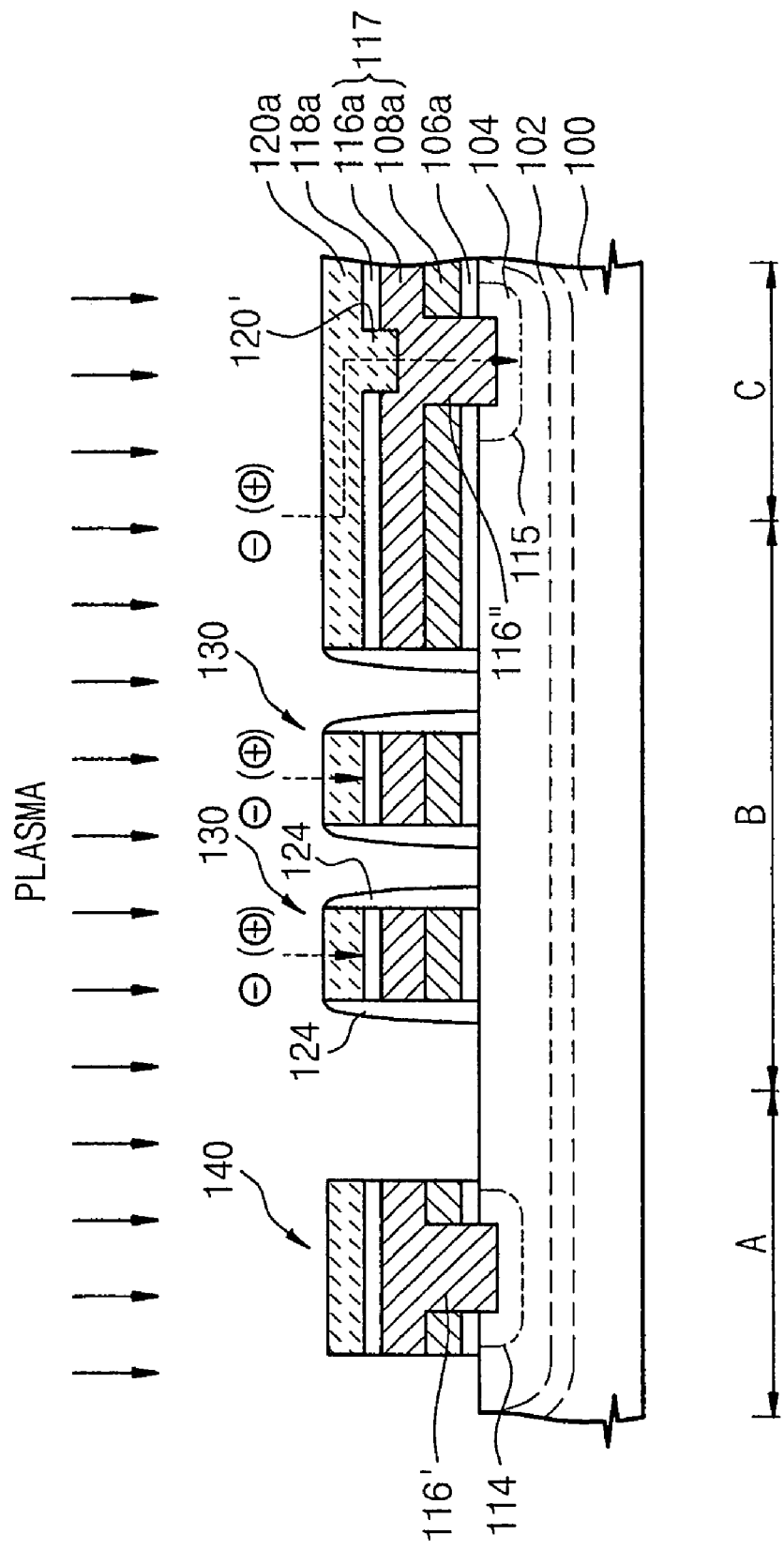

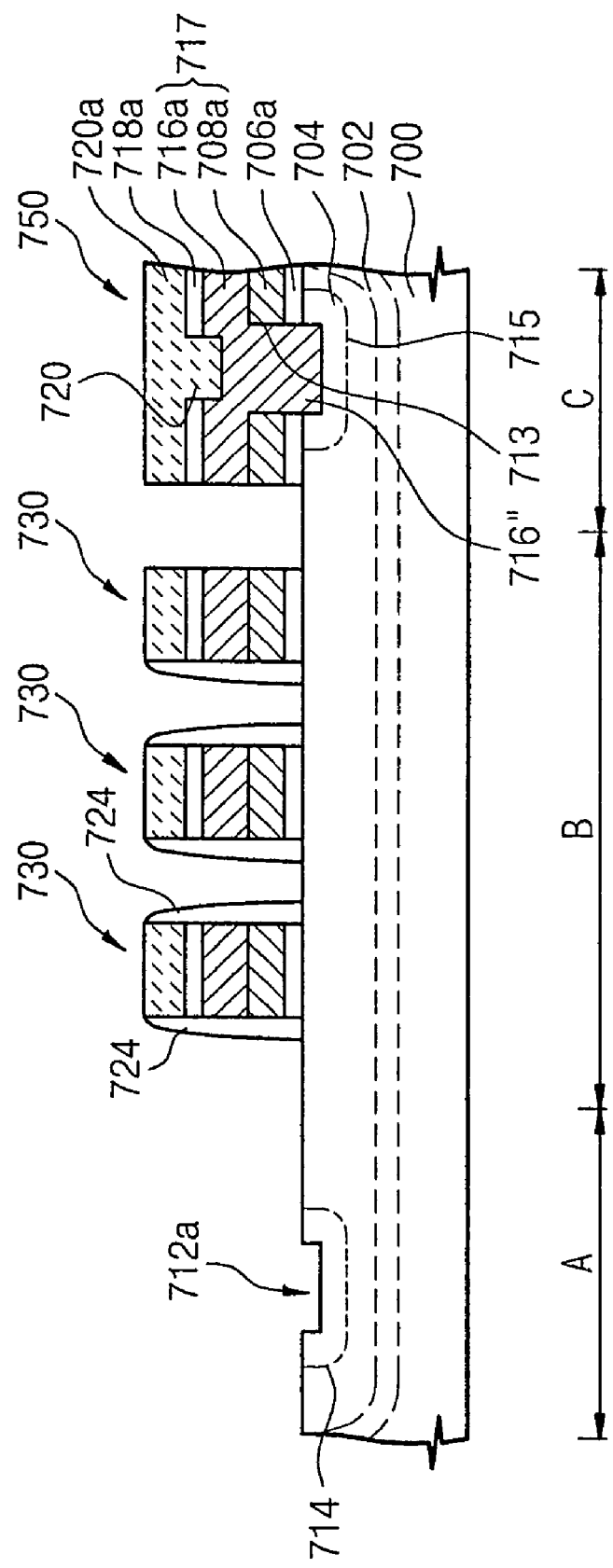

NONVOLATILE MEMORY DEVICE AND METHOD FOR FABRICATING THE SAME

BACKGROUND

The present disclosure generally relates to semiconductor memory devices and, more particularly, the present disclosure relates to nonvolatile memory devices and to methods for fabricating nonvolatile memory devices.

A claim of priority under 35 U.S.C. § 119 is made to Korean Patent Application No. 2006-97331, filed Oct. 2, 2006, the entire contents of which are hereby incorporated by reference.

In general, semiconductor memory devices are classified into volatile memory devices and nonvolatile memory devices. Volatile memory devices include, for example, a dynamic random access memory (DRAM.) Volatile memory devices have several distinguishing characteristics. For example, the volatile memory devices cannot retain data when power supply is interrupted. On the other hand, the nonvolatile memory devices can retain written data even if power supply is interrupted. Nonvolatile memory devices include, for example, a flash memory device capable of electrically programming and erasing data.

Due to an increase in demand for faster operating but smaller size flash memory, the integration density of flash memory is continually being increased. Furthermore, when a flash memory device is highly integrated, it may be desirable to ensure a predetermined thicknesses of a tunnel dielectric layer and a blocking oxide layer. The predetermined thickness of these layers may help avoid problems associated with cell operation and reliability. In order to ensure a proper thickness of these layers, the integration density of a flash memory device is increased by scaling down the flash memory device planarly rather than vertically.

As the flash memory device is being scaled down, a density of plasma used in a dry etching process for gate patterning is continuously increased. This increase in the plasma density may cause the concentration of an electric field over a small area of the tunnel oxide layer. This phenomenon may damage the tunnel oxide layer. This plasma damage of the tunnel oxide layer may lead to various problems such as, for example, a reduction in the reliability of memory cells, a reduction in the data retained within memory cells, etc.

Thus, there is a need for methods and systems to fabricate high integration density flash memory devices without the undesirable effects associated with an increase in plasma density and the like. The present disclosure is directed towards overcoming the limitations associated with conventional flash memory fabrication methods and systems.

SUMMARY OF THE INVENTION

One aspect of the present disclosure includes a method for fabricating a nonvolatile memory device. The method comprises providing a substrate, forming an insulating layer and a conductive layer on the substrate, forming an electrical connection path out of a portion of the conductive layer, through which the conductive layer is electrically connected to the substrate, and gate patterning the insulating layer and the conductive layer.

Another aspect of the present disclosure includes a method for fabricating a nonvolatile memory device. The method comprises providing a substrate including a cell array region and a dummy pattern region, forming a tunnel oxide layer and a floating gate layer on the substrate, forming a first butting contact out of a portion of the floating gate layer through which the floating gate layer is electrically connected to the substrate in the dummy pattern region, forming a blocking oxide layer and a control gate layer on the floating gate layer, and gate patterning the control gate layer, the blocking oxide layer, the floating gate layer, and the tunnel oxide layer to form a word line in the cell array region and a first dummy pattern in the dummy pattern region, wherein the word line extends in a first direction, and wherein the first dummy pattern extends in the first direction and has the first butting contact.

Yet another aspect of the present disclosure includes a method for fabricating a nonvolatile memory device. The method comprises providing a substrate including a cell array region and a dummy pattern region, forming a charge storage layer and a gate layer on the substrate, forming a butting contact out of a portion of the gate layer through which the gate layer is electrically connected to the substrate in the dummy pattern region, and gate patterning the gate layer and the charge storage layer to form a word line in the cell array region and a first dummy pattern in the dummy pattern region, wherein the word line extends in a first direction, and wherein the first dummy pattern extends in the first direction and includes the butting contact.

Yet another aspect of the present disclosure includes a nonvolatile memory device. The nonvolatile memory device includes a substrate including a cell array region and a first dummy pattern region, a word line extending in a first direction in the cell array region, and having a first insulating layer and a first conductive layer, and a first dummy pattern including the first insulating layer, the first conductive layer and a first butting contact formed from a portion of the first conductive layer, wherein the first butting contact provides an electrical connection path connecting the first conductive layer to the substrate.

Another aspect of the present disclosure includes a nonvolatile memory device. The device includes a substrate including a cell array region and a first dummy pattern region, a word line extending in a first direction in the cell array region, and including a first insulating layer and a first conductive layer, and a trench formed by removing a portion of the substrate in the first dummy pattern region, and extending in the first direction.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIGS. 7A through 7H are sectional views taken along line I-I' of FIG. 6, illustrating a method for fabricating the nonvolatile memory device according to an alternative exemplary disclosed embodiment.

DETAILED DESCRIPTION OF PREFERRED EMBODIMENTS

Hereinafter, a nonvolatile memory device and a method for fabricating the same it will be fully described with reference to the accompanying drawings.

Figure 1:
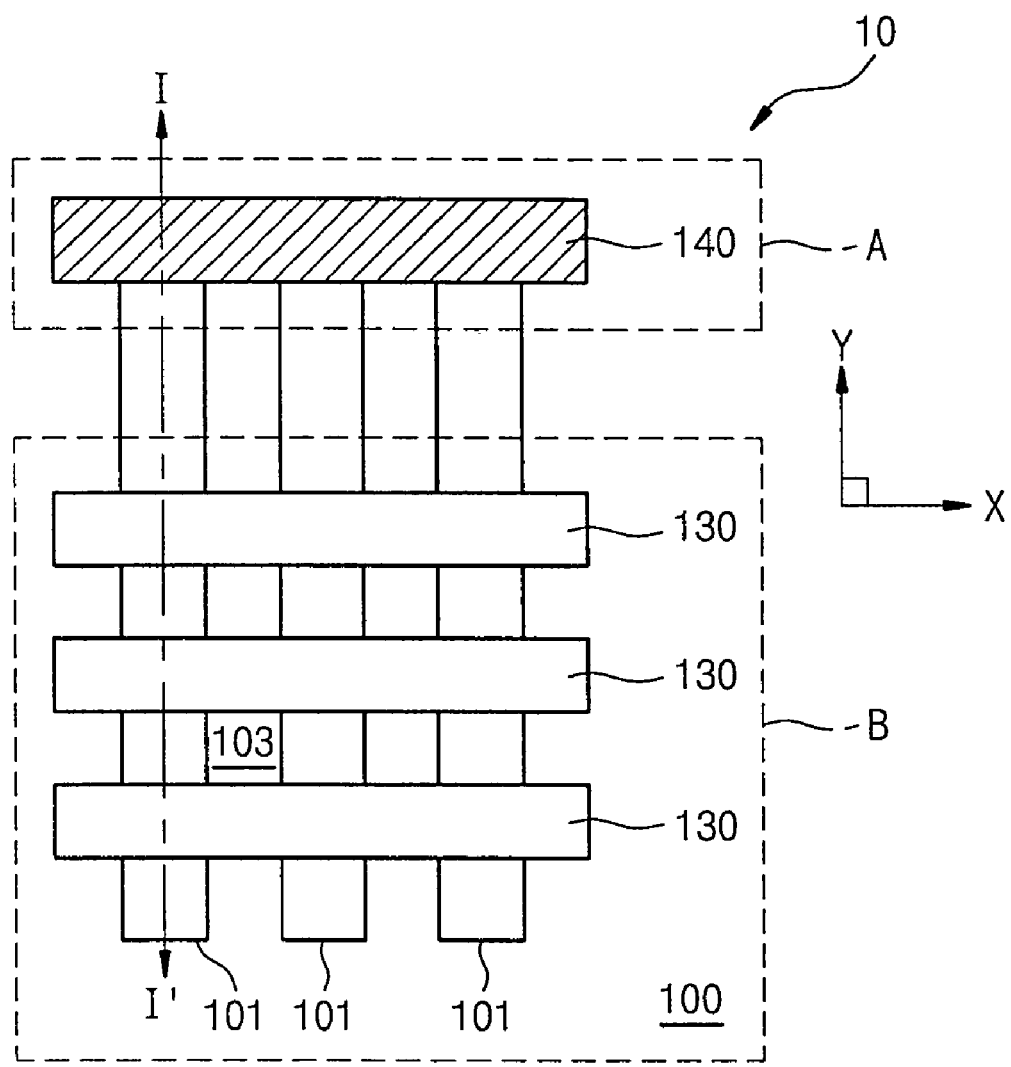
FIG. 1 is a plan view of a nonvolatile memory device according to an exemplary disclosed embodiment.

FIG. 1 is a plan view of a nonvolatile memory device according to an exemplary disclosed embodiment. Referring to FIG. 1, the nonvolatile memory device is a flash memory device 10 that performs a programming operation by storing charges in a conductor, i.e., a floating gate. To this end, the flash memory device 10 includes a cell array region B. The cell array region B includes a plurality of active regions 101 extending along the Y-axis over a substrate 100, and a plurality of word lines 130 extending along the X-axis that is substantially perpendicular to the active regions 101. Furthermore, the active regions 101 are separated from each other by means of a device isolation layer 103. In addition, each of the word lines 130 includes a floating gate that stores charges. Furthermore, the flash memory device 10 includes a dummy pattern region A having a dummy pattern 140 extending along the X-axis over the substrate 100. Specifically, the dummy pattern 140 is a pattern that minimizes the damage due to plasma by discharging charges into the substrate 100 during the plasma dry etching process.

FIGS. 2A through 2F are sectional views taken along line I-I' of FIG. 1, illustrating a method for fabricating the nonvolatile memory device according to an exemplary disclosed embodiment.

Figure 2A:
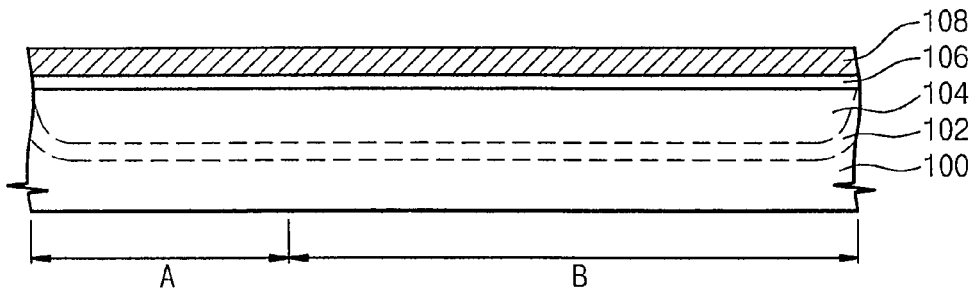
FIGS. 2A through 2F are sectional views taken along line I-I' of FIG. 1, illustrating a method for fabricating the nonvolatile memory device according to an exemplary disclosed embodiment.

Referring to FIG. 2A, the flash memory device 10 includes a semiconductor substrate 100 of a first conductive type. In addition, a first well 102 of a second conductive type is formed in the semiconductor substrate 100. Furthermore, a second conductive well 104 of the first conductive type is formed in the first well 102. For example, an n-well 102 is formed in the p-type silicon substrate 100, and a p-well 104 is formed in the n-well 102. Specifically, the p-well 104 may be designated as a pocket p-well, and the n-well 102 may be designated as a deep n-well. In addition, a first dielectric layer 106, i.e., an insulating layer, is formed over the substrate 100, and a first conductive layer 108 is sequentially formed on the first dielectric layer 106. In particular, the first dielectric layer 106 constitutes a tunnel insulating layer of the flash memory device 10. In addition, the first conductive layer 108 may be formed of polysilicon or metal. Moreover, the first dielectric layer 106 and the first conductive layer 108 are formed in both the cell array region B and the dummy pattern region A.

Figure 2B:
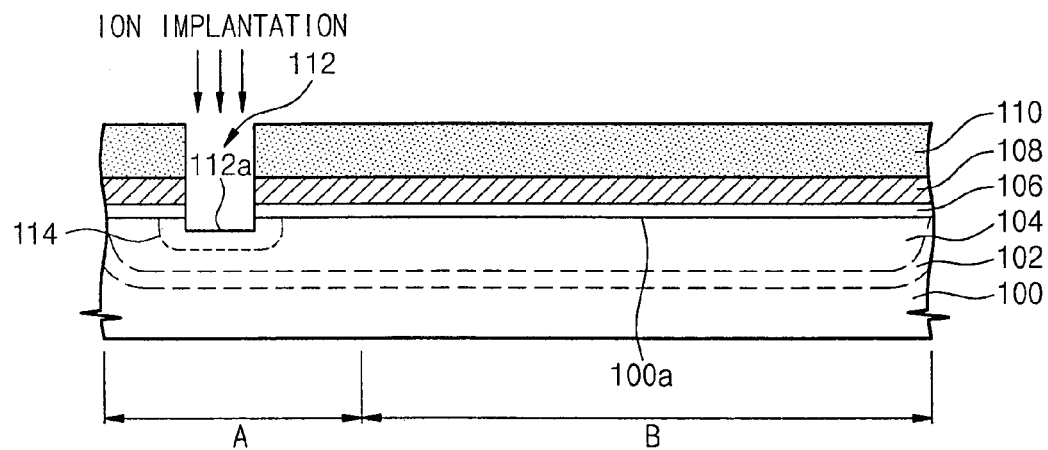

Referring to FIG. 2B, a photoresist pattern 110 is formed on the first conductive layer 108 by any well-known photolithography process. Furthermore, the photoresist pattern 110 covers the cell array region B of the substrate 100 and partially exposes the dummy pattern region A. In addition, portions of the first conductive layer 108 and the first dielectric layer 106 are removed through an etching process using the photoresist pattern 110 as a mask to form a contact hole 112. The contact hole 112 partially exposes a surface of the substrate 100. When forming the contact hole 112, the substrate 100 may be over-etched such that a bottom surface 112a of the contact hole 112 is lower than a surface 100a of the substrate 100. After forming the contact hole 112, first conductive type impurities, e.g., p-type impurities, are implanted into the substrate 100 through ion implantation using the photoresist pattern 110 as a mask to form a p-well 114 in the substrate 100 under the contact hole 112. In an exemplary embodiment, a p-type impurity concentration of the p-well 114 is greater than that of the pocket p-well 104.

Figure 2C:
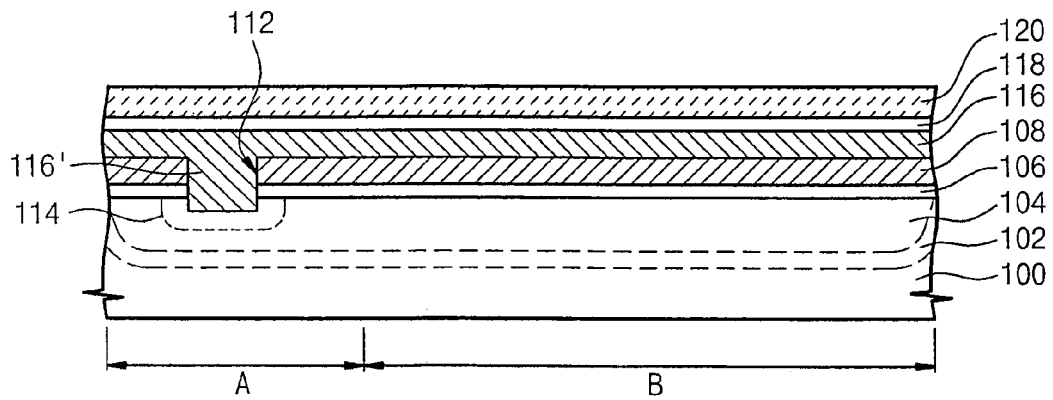

Referring to FIG. 2C, the photoresist pattern 110 is removed and a second conductive layer 116 is formed on the first conductive layer 108. Specifically, when the second conductive layer 116 is formed on the first conductive layer 108, the second conductive layer 116 fills the contact hole 112 to thereby form a butting contact 116' that directly connects the second conductive layer 116 to the substrate 100. That is, the butting contact 116' serves as a connection path that electrically connects the second conductive layer 116 and the substrate 100. In an exemplary embodiment, the second conductive layer 116 may be formed of polysilicon or metal. Furthermore, the first and second conductive layers 108 and 116 constitute the floating gate of the flash memory device.

A second dielectric layer 118 is formed on the second conductive layer 116, and a third conductive layer 120 is then formed on the second dielectric layer 118. For example, the third conductive layer 120 may be formed of polysilicon or metal. In addition, the third conductive layer 120 constitutes a control gate of the flash memory device. Moreover, the second dielectric layer 118 is interposed between the control gate and the floating gate so that it acts as a blocking dielectric layer preventing charges stored in the floating gate from being tunneled into the control gate. In an exemplary embodiment, the second dielectric layer 118 may be formed of oxide/nitride/oxide (ONO) layer that has sufficient thickness and resistivity against high voltage, and also has dielectric properties. Furthermore, the ONO layer is configured with a nitride layer interposed between the oxide layers.

Figure 2D:
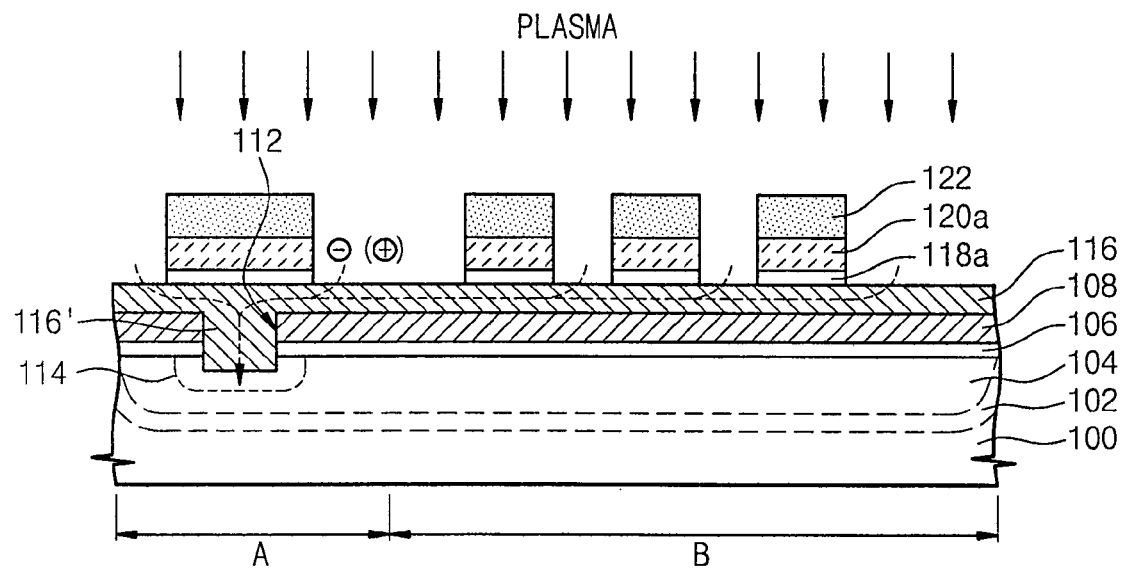

Referring to FIG. 2D, plasma dry etching is performed for gate patterning using a photoresist pattern 122 as a mask. To this end, the photoresist pattern 122 has a shape that is adapted for gate patterning. FIG. 2D shows that the third conductive layer 120 and the second dielectric layer 118 are selectively removed during the plasma dry etching process thereby forming a third conductive layer pattern 120a and a second dielectric layer pattern 118a. However, the second conductive layer 116 is not patterned. Because the second conductive layer 116 is not completely etched, plasma charges accumulate in the second conductive layer 116. Furthermore, the charges accumulated in the butting contact 116' are discharged through the substrate 100. In particular, because the p-well 114, that has a higher doping concentration than the pocket p-well 104, is formed under the butting contact 116', the charges accumulated in the second conductive layer 116 are effectively discharged through the substrate 100.

Figure 2E:
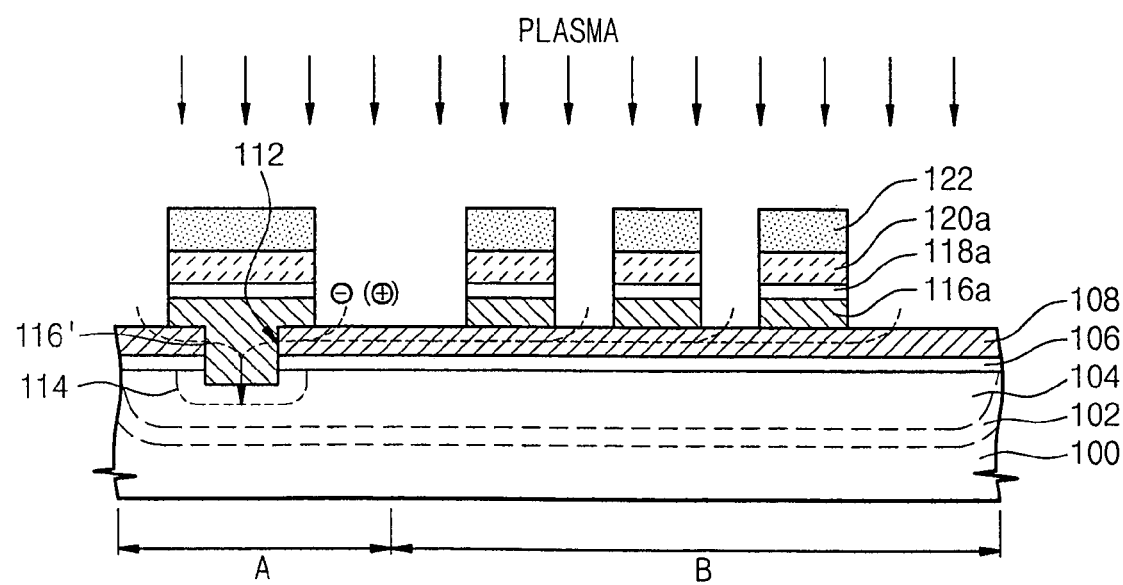

Referring to FIG. 2E, in an exemplary embodiment, the plasma dry etching process is performed so that the second conductive layer 116 is etched to form a second conductive layer pattern 116a. Furthermore, FIG. 2E represents a state where the first conductive layer 108 is not patterned yet. Because the first conductive layer 108 is not etched at this time, the charges are accumulated in the first conductive layer 108. Moreover, the charges accumulated in the first conductive layer 108 are discharged into the substrate 100 through the butting contact 116'.

Referring to 2F, plasma dry etching is performed to form a first conductive layer pattern 108a and a first dielectric layer pattern 106a. In addition, a spacer 124 is formed to thereby form a word line 130 in the cell array region B. In an exemplary embodiment, the word line 130 has a stacked structure in which the tunnel dielectric layer 106a, the floating gate 117, the blocking dielectric layer 118a and the control gate 120a are sequentially stacked. In addition, a dummy pattern 140 is formed in the dummy pattern region A. In particular, the dummy pattern 140 is separated from the word line 130 by gate patterning so that it is electrically isolated. Therefore, the dummy pattern 140 does not electrically affect the cell array region B when the device is operating.

In the above-described exemplary method for fabricating the nonvolatile memory device, with reference to FIGS. 2A through 2F, the floating gate 117 configured with the first conductive layer 108 and the second conductive layer 116 is electrically connected to the substrate 100. Accordingly, plasma charges are discharged into the substrate 100 through the floating gate 117 in the gate patterning using the plasma dry etching process.

Figure 2F:
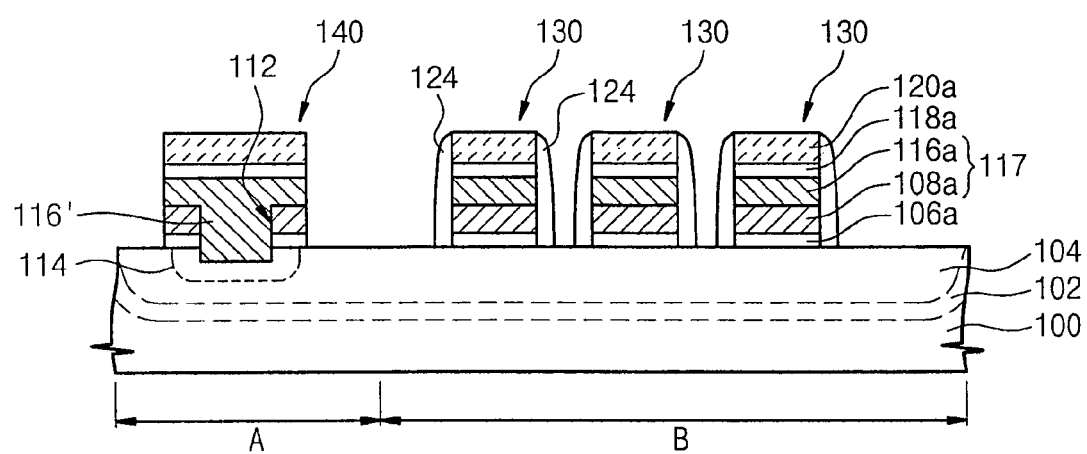
Figure 3A:
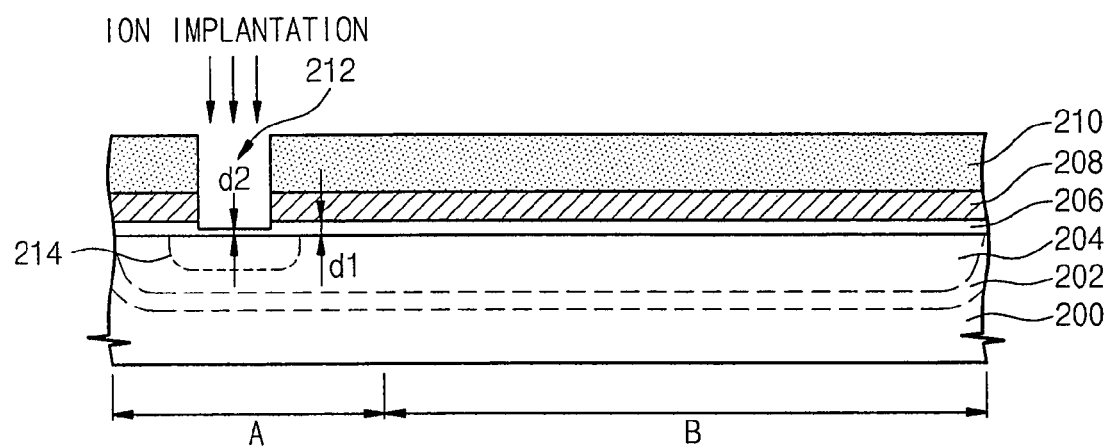
FIGS. 3A and 3B are sectional views illustrating a method for fabricating the nonvolatile memory device according to an alternative exemplary disclosed embodiment.
Figure 3B:
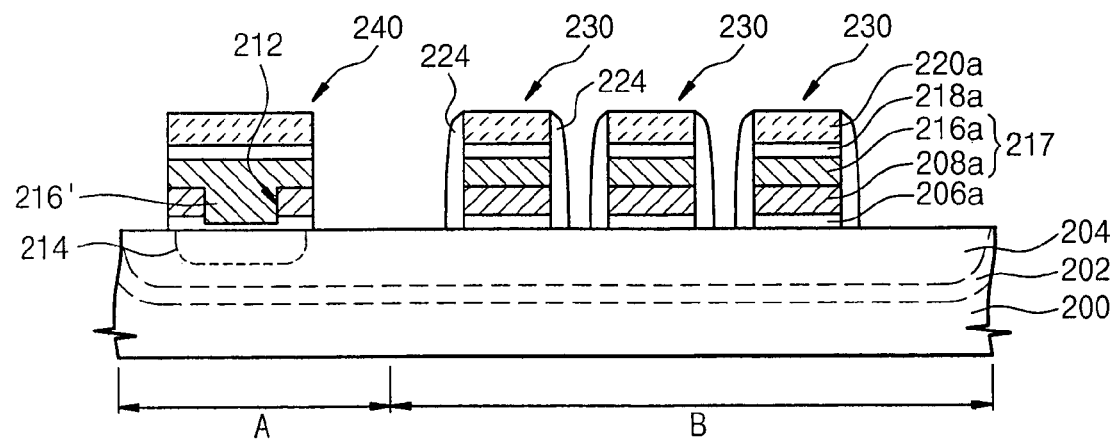

FIGS. 3A and 3B are sectional views illustrating another exemplary embodiment for the method for fabricating the nonvolatile memory device according. Because the embodiment discussed below is similar to the fabrication process of the exemplary embodiment illustrated in FIGS. 2A through 2F, the same features will be described in brief or omitted herein, but distinguishing features may be focused on in the following description.

Referring to FIG. 3A, in an exemplary embodiment, a first dielectric layer 206 and a first conductive layer 208 are sequentially formed on a p-type substrate 200. In particular, the first dielectric layer 206 is formed to a first thickness d1. Furthermore, a pocket p-well 204 is formed in the p-type substrate 200, and a deep n-well 202 is formed to surround the pocket p-well 204. Moreover, a photoresist pattern 210 is formed on the conductive layer 208 such that it covers a cell array region B but does not cover a portion of the dummy pattern region A. In addition, an etching process is performed using the photoresist pattern 210 as a mask to form a contact hole 212 in the dummy pattern region A.

When forming the contact hole 212, only a portion of the first dielectric layer 212 is etched so that the first dielectric layer 206 with a second thickness d2 is left remaining below the contact hole 212, wherein the second thickness d2 is smaller than the first thickness d1. The second thickness d2 is a thickness such that charges accumulated in a second conductive layer 216a are sufficiently tunneled toward the substrate 100 with ease during a dry etching process for gate patterning. Furthermore, an ion implantation process is performed to form a heavily doped p-well 214 under the contact hole 212. The concentration of the p-well 214 is typically greater than that of the pocket p-well 204. The processes subsequent to the ion implantation process are identical to those illustrated in FIGS. 2C through 2E.

Referring to FIG. 3B, a spacer 224 is formed. Thus, a word line 230 is completed in the cell array region B, which is configured with a tunnel dielectric layer 206a, a floating gate 217, a blocking dielectric layer 218a and a control gate 220a, all of which are stacked in sequence. In addition, a dummy pattern 140, which has no electrical effect on the device, is formed in the dummy pattern region A.

Figure 4A:
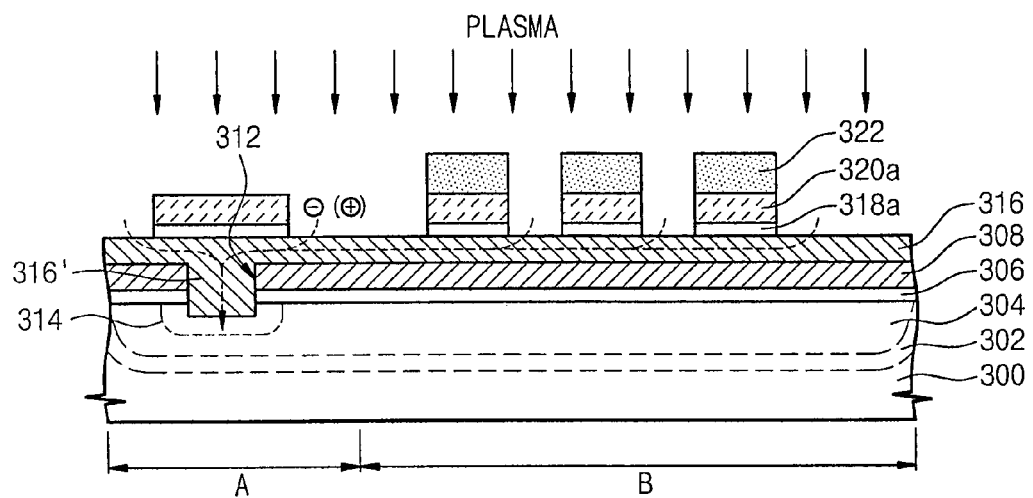
FIGS. 4A and 4B are sectional views illustrating another alternative exemplary disclosed embodiment.
Figure 4B:
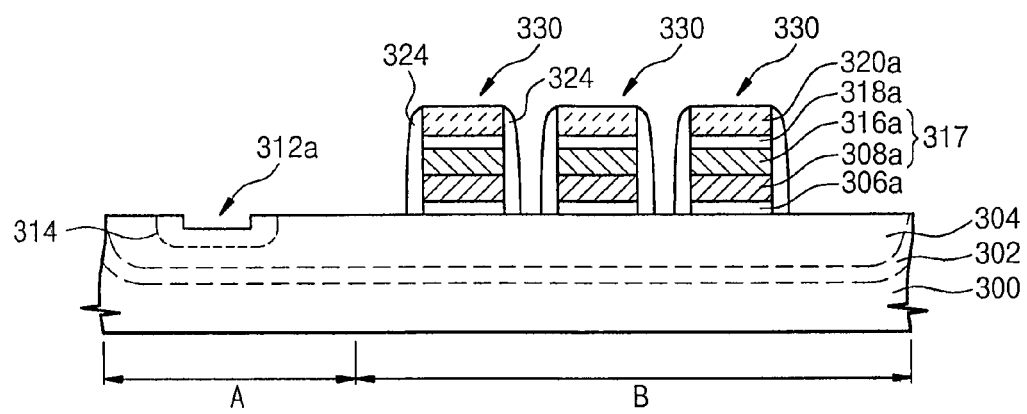

FIGS. 4A and 4B are sectional views illustrating yet another exemplary embodiment for the method for fabricating a nonvolatile memory device. The currently disclosed exemplary embodiment is similar to the previous exemplary embodiment illustrated in FIGS. 2A through 2F. Therefore, the same features will be described in brief or omitted herein, but distinguishing features may be focused on in this description. In addition, the process prior to FIG. 4A is replaced by the description of FIGS. 2A through 2C.

Referring to FIG. 4A, a photoresist pattern 322 is formed using a well-known photo process. Then, plasma etching is performed using the photoresist pattern 322 as a mask to form a third conductive layer 320a and a second dielectric pattern 318a. Specifically, the photoresist pattern 322, which is formed for gate patterning, opens the dummy pattern region A entirely. FIG. 4A shows a state when the second conductive layer 316 is not completely patterned yet while the plasma dry etching is being performed. Because the second conductive layer 316 is not completely etched, the charges due to plasma generation are accumulated in the second conductive layer 316. These accumulated charges in the second conductive layer 316 are discharged into the substrate 300 through a butting contact 316'.

Referring to FIG. 4B, plasma dry etching is performed to form a first conductive layer pattern 308a and a first dielectric layer pattern 306a. Subsequently, a spacer 324 is formed. Thus, a word line 330 is completed in the cell array region B, which is configured with a tunnel dielectric layer 306a, a floating gate 317, a blocking dielectric layer 318a and a control gate 320a, all of which are stacked in sequence. In addition, because there is no mask in the dummy pattern region A, the dummy pattern 240 of FIG. 2F is not formed but only a trench 312a that is a portion of the contact hole 312 remains instead.

Figure 5A:
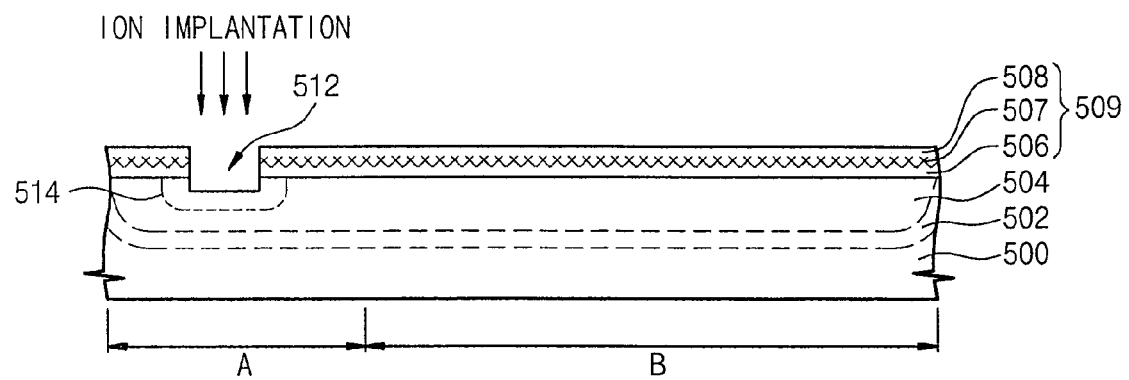
FIGS. 5A through 5D are sectional views illustrating a method for fabricating the nonvolatile memory device according to yet another alternative exemplary disclosed embodiment.
Figure 5B:
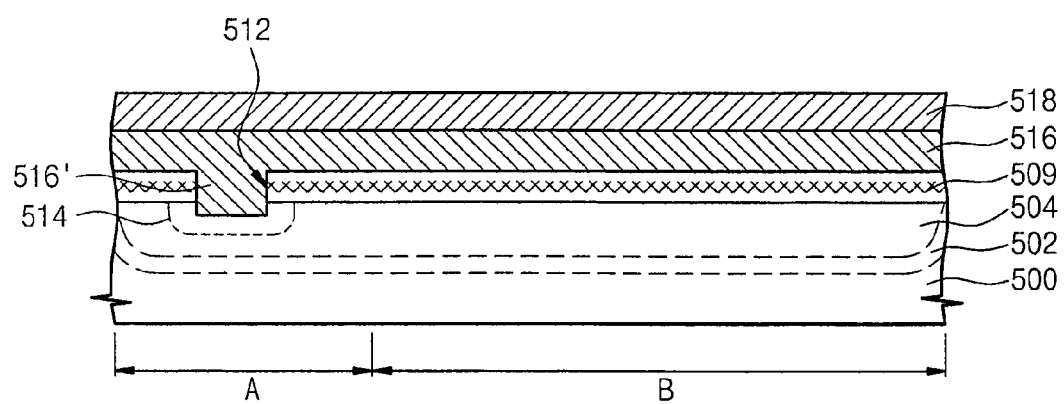

FIGS. 5A and 5B are sectional views illustrating an alternative exemplary embodiment for the method for fabricating a nonvolatile memory device. This exemplary embodiment relates to a method for fabricating a SONOS memory device that performs a programming operation by storing charges in an insulating layer disposed between a gate electrode and a substrate.

Referring to FIG. 5A, an insulating layer 509 is formed on a p-type substrate 500. The insulating layer 509 has a multi-stacked structure in which a tunnel dielectric layer 506, a charge storage layer 507, and a blocking dielectric layer 508, are sequentially stacked. For example, the insulating layer 509 may be configured with an ONO layer in which the tunnel dielectric layer 506 and the blocking dielectric layer 508 are formed of oxide and the charge storage layer 507 is formed of nitride. Furthermore, the programming operation is performed in such a manner that the charges are trapped in the nitride layer. In addition, a pocket p-well 504 and a deep n-well 502 are formed in the p-type substrate 500. Furthermore, a portion of the insulating layer 509 is removed by any well-known etching process to form a contact hole 512 in the dummy pattern region A. In addition, a heavily doped p-well 514 is formed below the contact hole 512, wherein the concentration of the heavily doped p-well 514 may be made greater than that of the pocket p-well 504 by the use of any well-known ion implantation process.

Referring to FIG. 5B, a first conductive layer 516 and a second conductive layer 518 are formed sequentially. Furthermore, a portion of the first conductive layer 516 fills the contact hole 512 to constitute a butting contact 516'. This butting contact 516' electrically connects the first conductive layer 516 to the substrate 500. In an exemplary embodiment, the first conductive layer 516 and the second conductive layer 518 constitute a gate electrode, and are formed of polysilicon or metal.

Figure 5C:
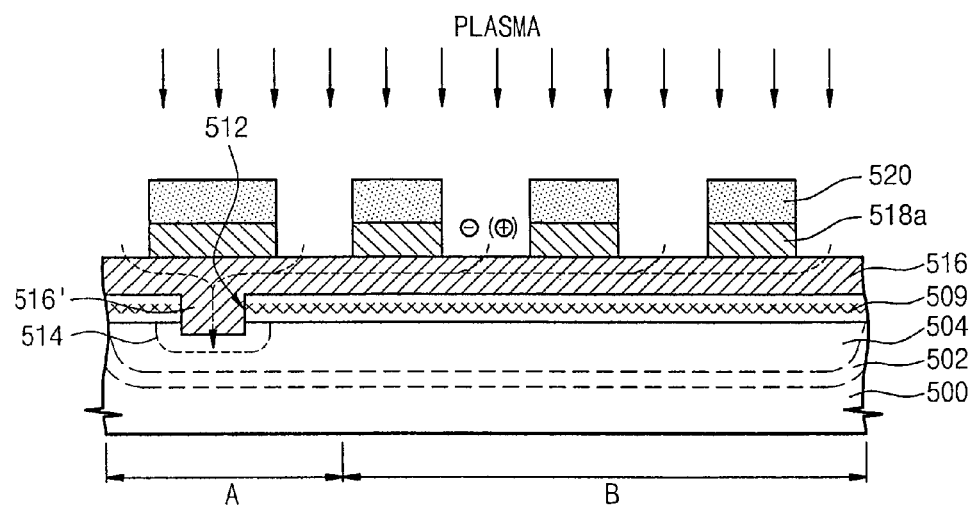

Referring to FIG. 5C, a plasma dry etching is performed for gate patterning using a photoresist pattern 520 as a mash. The photoresist pattern 520 is formed by any well-known photo process. FIG. 5C shows a state where the second conductive layer pattern 518a is formed by plasma dry etching process and the first conductive layer is not patterned yet. In an exemplary embodiment, the charges accumulated in the first conductive layer 516 by the plasma dry etching process are discharged into the substrate 500 through the butting contact 516'.

Figure 5D:
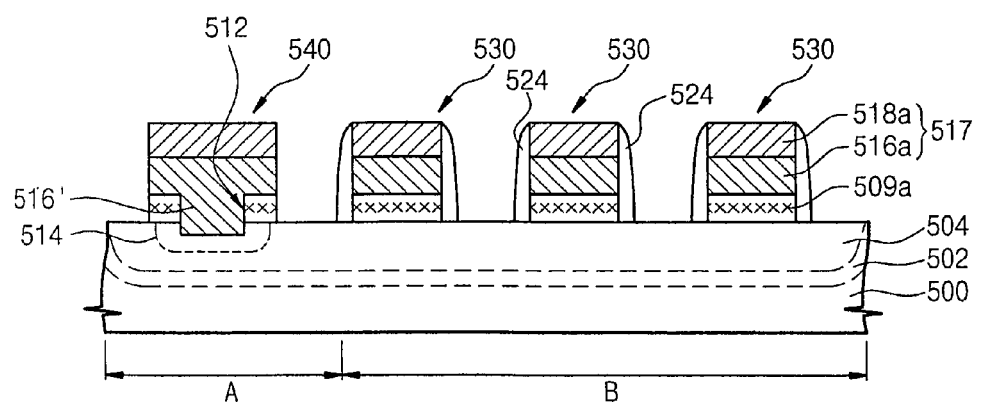

Referring to FIG. 5D, a spacer 524 is formed after a gate patterning process, and a word line 530 is completed in the cell array region B. In particular, the word line 530 is shaped such that an insulating layer 509a is interposed between a gate electrode 517 and the substrate 500. Furthermore, a dummy pattern 540, which does not operate electrically, is formed in the dummy pattern region A.

In yet another exemplary embodiment, as illustrated in FIGS. 3A and 3B, the insulating layer 509a of the dummy pattern region A may be formed thinner than the insulating layer 509a of the cell array region B. In addition, as illustrated in FIGS. 4A and 4B, the photoresist pattern 520 may not be formed in the dummy pattern region A during gate patterning, and thus the dummy pattern 540 may not be formed in the dummy pattern region A.

Figure 6:
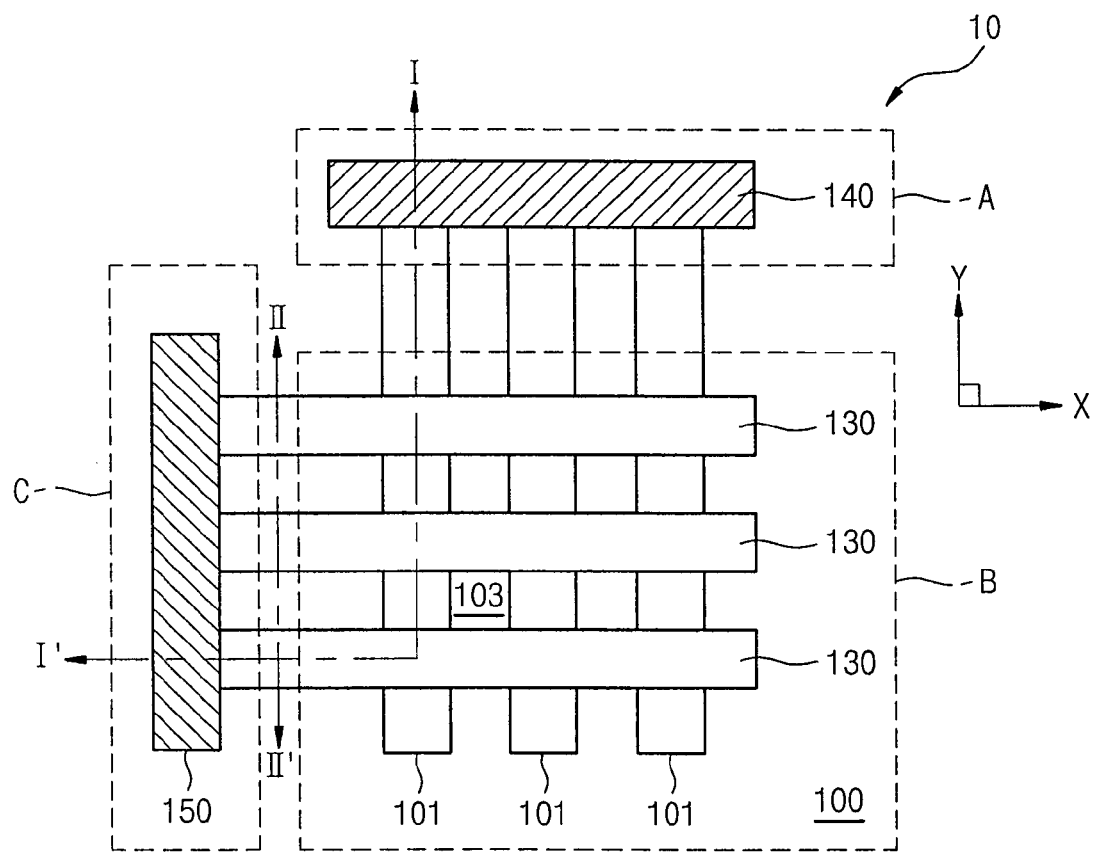
FIG. 6 is a plan view of a nonvolatile memory device according to an alternative exemplary disclosed embodiment.

FIG. 6 is a plan view of a nonvolatile memory device 10 according to an alternative exemplary disclosed embodiment. Referring to FIG. 6, the nonvolatile memory device 10 (e.g., flash memory device) includes a cell array region B in which a plurality of active regions 101 extend along the Y-axis over a substrate 100, and a plurality of word lines 130 extending along the X-axis that is substantially perpendicular to the extending direction of the active regions 101. Furthermore, the active regions 101 are separated from each other by means of a device isolation layer 103. In addition, each of the word lines 130 includes a floating gate that stores charges. Furthermore, the nonvolatile memory device 10 includes a first dummy pattern region A having a dummy pattern 140 extending along the X-axis over the substrate 100, and a second dummy pattern 150 extending along the Y-axis in a second dummy pattern region C. In an exemplary embodiment, the first dummy pattern 140 plays a role in discharging plasma charges into the substrate 100 when performing a plasma dry etching process for gate patterning, and a second dummy pattern 150 plays a role in discharging plasma charges into the substrate 100 during a plasma dry etching process after the gate patterning.

FIGS. 7A through 7H are sectional views taken along line I-I' of FIG. 6, illustrating a method for fabricating the nonvolatile memory device according to an exemplary disclosed embodiment.

Referring to FIG. 7A, a deep n-well 102 is formed in a p-type semiconductor substrate 100, and a pocket p-well 104 is formed inside the deep n-well 102. Furthermore, a first dielectric layer 106 is formed on the p-type substrate 100, and a first conductive layer 108 is sequentially formed on the first conductive layer 108. The first dielectric layer 106 constitutes a tunnel dielectric layer of the nonvolatile memory device, for example, the flash memory device. Furthermore, the first conductive layer 108 is formed of, for example, polysilicon or metal. Moreover, the first dielectric layer 106 and the first conductive layer 108 are formed over the substrate 100 in both the cell array region B and the first and second dummy pattern regions A and C, respectively.

Referring to FIG. 7B, a photoresist pattern 110 is formed on the first conductive layer 108 using any well-known photo process. The photoresist pattern 110 has a shape such that it coves the cell array region B of the substrate 100 but partially opens the first and second dummy pattern regions A and C. Furthermore, portions of the first conductive layer 108 and the first dielectric layer 106 are removed by an etching process using the photoresist pattern 110 as a mask, thereby forming first and second contact holes 112 and 113, respectively. These first and second holes 112 and 113, respectively, partially expose a surface of the substrate 100 in the first and second dummy pattern regions A and B, respectively. In addition, in forming the first contact hole 112, the substrate 100 may be over-etched such that a bottom surface 112a of the first contact hole 112 is disposed lower than a surface 100a of the substrate 100. Likewise, a bottom surface 113a of the second contact hole 113 may be lower than the surface 100a of the substrate 100.

After forming the first and second contact holes 112 and 113, an ion implantation process is performed using the photoresist pattern 110 as a mask to form a first p-well 114 under the first contact hole 112. Typically, the p-type impurity concentration of the p-well 114 is greater than the p-type impurity concentration of the pocket p-well 104. Likewise, a heavily doped second p-well 115 is formed under the second contact hole 113.

Referring to FIG. 7C, the photoresist pattern 110 is removed, and a second conductive layer 116 is then formed on the first conductive layer 108. Furthermore, when the second conductive layer 116 is formed on the first conductive layer 108, the second conductive layer 116 is filled into the first and second contact holes 112 and 113. Therefore, first and second butting contacts 116' and 116" connecting the second conductive layer 116 to the substrate 100 are formed in the first and second dummy pattern regions A and B, respectively. That is, the first and second butting contacts 116' and 116", respectively, act as connection paths that electrically connect the second conductive layer 116 to the substrate 100. In an exemplary embodiment, the second conductive layer 116 may be formed of, for example, polysilicon or metal. Furthermore, the first and second conductive layers 108 and 116 constitute a floating gate of the flash memory device.

A second dielectric layer 118 is formed on the second conductive layer 116. Specifically, the second dielectric layer 118 is interposed between the control gate and the floating gate, and serves as a blocking dielectric layer preventing the charges stored in the floating gate from being tunneled into the control gate. In an exemplary embodiment, the second dielectric layer 118, i.e., the blocking dielectric layer may be configured as ONO layer in which a nitride layer is interposed between oxide layers. Moreover, a potion of the second dielectric layer 118 is removed to form a third contact hole 119 that exposes a portion of the second conductive layer 116 in the second dummy pattern region C. In addition, the second conductive layer 116 may be over-etched when the third contact hole 119 is formed.

Referring to FIG. 7D, a third conductive layer 120 is formed on the second conductive layer 118. When forming the third conductive layer 120, the third conductive layer 120 fills the third contact hole 119 to form a third butting contact 120'. The third butting contact 120' electrically connects the third conductive layer 120 to the second conductive layer 116. Therefore, the third conductive layer 120 is electrically connected to the substrate 100 through the third butting contact 120' and the second butting contact 116". In an exemplary embodiment, the third conductive layer 120 may be formed of polysilicon or metal. Furthermore, the third conductive layer 120 constitutes a control gate of the flash memory device.

Referring to FIG. 7E, a photoresist pattern 122 is formed using any well-known photo process. In an exemplary embodiment, the photoresist pattern 122 has a shape adaptive for gate patterning. Furthermore, dry etching is performed for gate patterning using the photoresist pattern 122 as a mask. To this end, FIG. 7E shows that a third conductive layer pattern 120a and a second dielectric layer pattern 118a are formed and the second conductive layer is not patterned yet. Because the second conductive layer 116 is not patterned and is formed on an entire surface of the substrate 100, the charges generated due to plasma are accumulated in the second conductive layer 116. In addition, the charges accumulated in the second conductive layer 116 are discharged into the substrate 100 through the first and second butting contacts 116' and 116". Because the first and second butting contacts 116' and 116" have the first and second p-wells 114 and 115 doped with p-type impurity thereunder, wherein the concentrations of the first and second p-wells 114 and 115 are greater than the pocket p-well 104, the charges accumulated in the second conductive layer 116 are effectively discharged into the substrate 100.

Figure 7F:
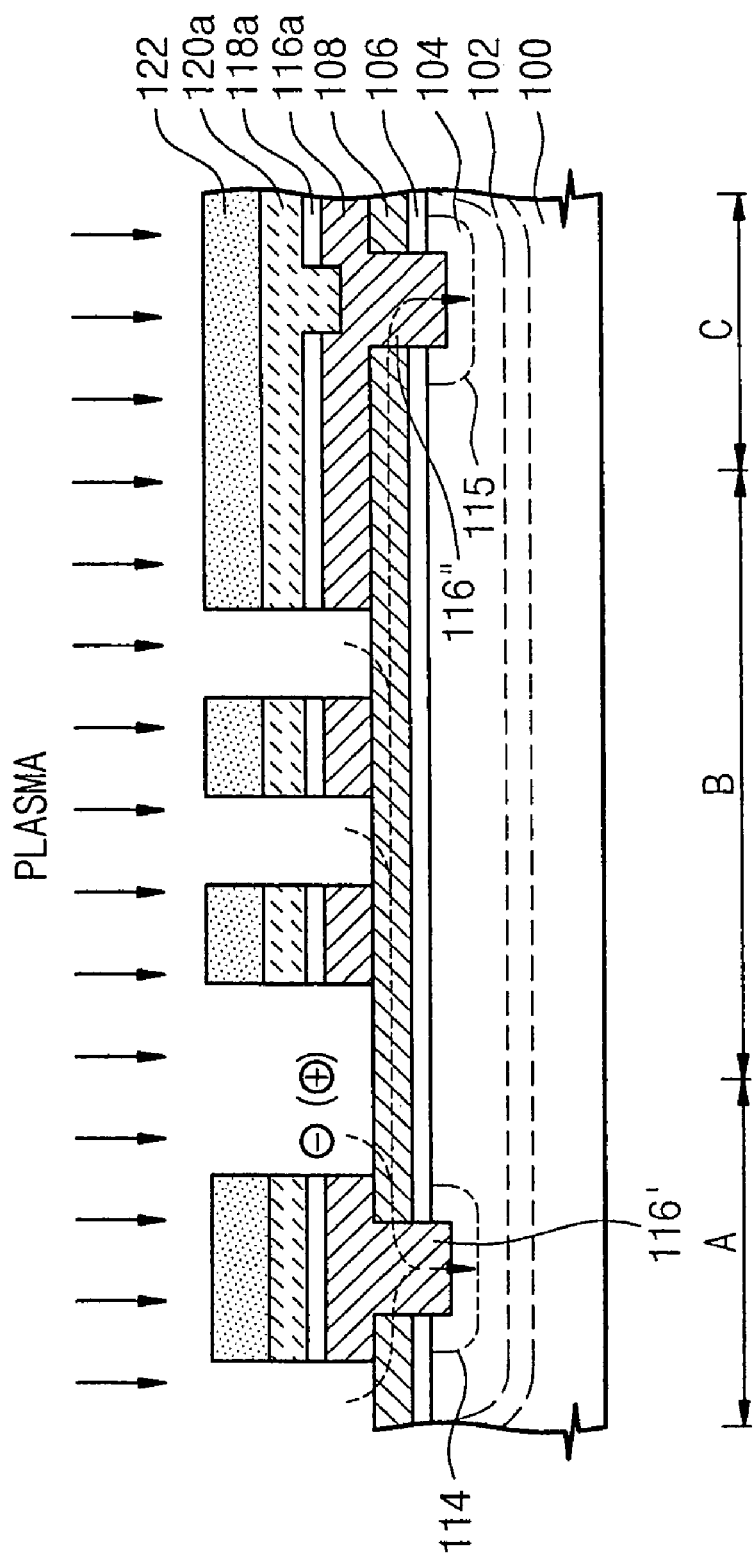

Referring to FIG. 7F, the plasma dry etching is performed so that the second conductive layer 116 is selectively etched to form a second conductive layer pattern 116a. FIG. 7F shows a state where the first conductive layer 108 is not patterned and formed on entire surface of the substrate 100. Therefore, the charges generated by plasma are accumulated on the first conductive layer 108. Furthermore, the charges accumulated in the first conductive layer 108 are discharged into the substrate 100 through the first and second butting contacts 116' and 116".

Referring to FIG. 7G, the plasma dry etching is performed to form a first conductive layer pattern 108a and a first dielectric layer pattern 106a. Furthermore, when forming a spacer 124 by depositing and etching the insulating layer, a word line 130 is formed in a cell array region B. Specifically, the word line 130 is configured with a tunnel dielectric layer 106a, a floating gate 117, a blocking dielectric layer 118a and a control gate 120a, all of which are stacked in sequence. In addition, a first dummy pattern 140 is formed in the first dummy pattern region A. Because the first dummy pattern 140 is electrically isolated, it has no effect on the cell array region B during device operation.

When using the plasma dry etching for forming the spacer 124, the charges generated by plasma are accumulated in the third conductive layer pattern 120a. These charges which are accumulated in the third conductive layer pattern 120a, flow into the floating gate 117 through the third butting contact 120', and are discharged into the substrate 100 through the second butting contact 116".

The control gate 120a and the floating gate 117 are electrically connected to the substrate 100 through the third and second butting contacts 120' and 116", respectively, formed in the second dummy pattern region C. Furthermore, the plasma charges accumulated in the floating gate 117 are discharged into the substrate 100 through the first butting contact 116' formed in the first dummy pattern region A during the gate patterning process. After the gate patterning, the plasma charges accumulated in the control gate 120a are discharged into the substrate 100 through the third and second butting contacts 120' and 116". Due to this discharge of plasma charges into the substrate 100, there may be a reduction in the possibility of a plasma attack.

Figure 7H:
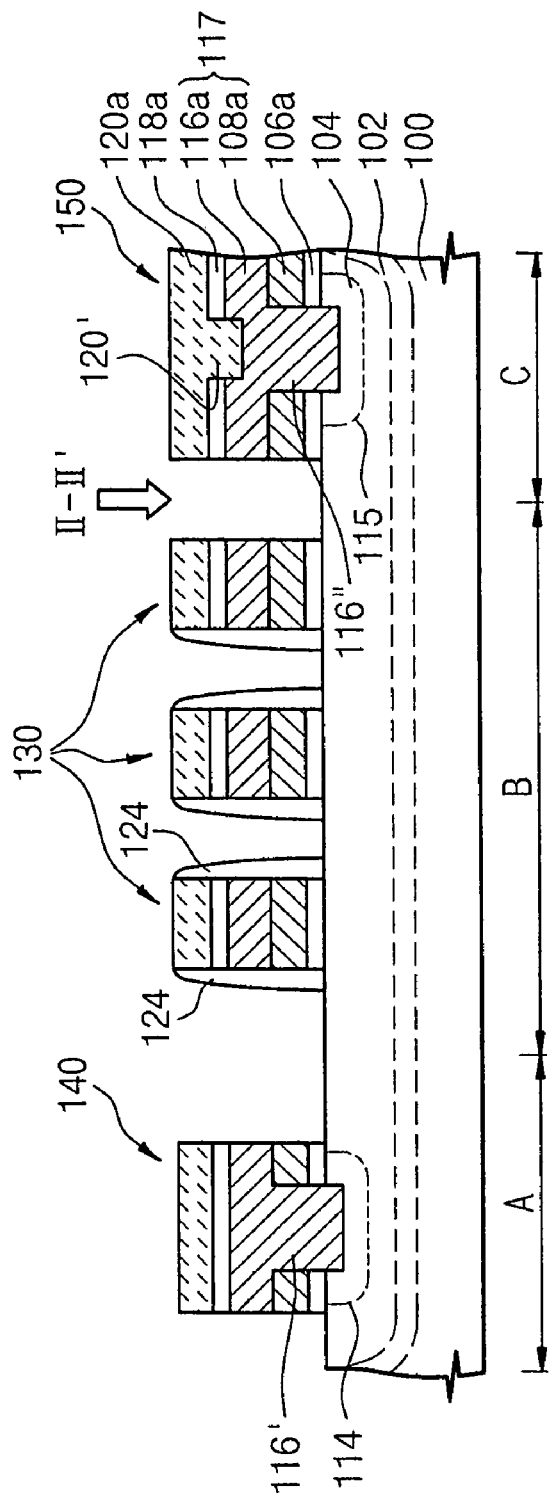

Referring to FIG. 7H, the first dummy pattern 140 is separated from the word line 130 during the gate patterning, but the second dummy pattern 150 stays connected to the word line 130. Therefore, a portion of the word line 130 adjacent to the second dummy pattern region C, is cut to form the second dummy pattern 150 such that is electrically isolated (see line II-II' of FIG. 6). The second dummy pattern 150 that is now electrically isolated has no effect on the cell array region B.

The method for fabricating the nonvolatile memory device as illustrated in FIGS. 7A through 7H can be applied to the method for fabricating a NAND flash memory device. When fabricating the NAND flash memory device by employing the method of FIGS. 7A through 7H, the contact for electrically connecting the control gate to the floating gate in the select and ground gates is formed at the same time when the third butting contact 120' of FIG. 7D is formed.

Figure 8:
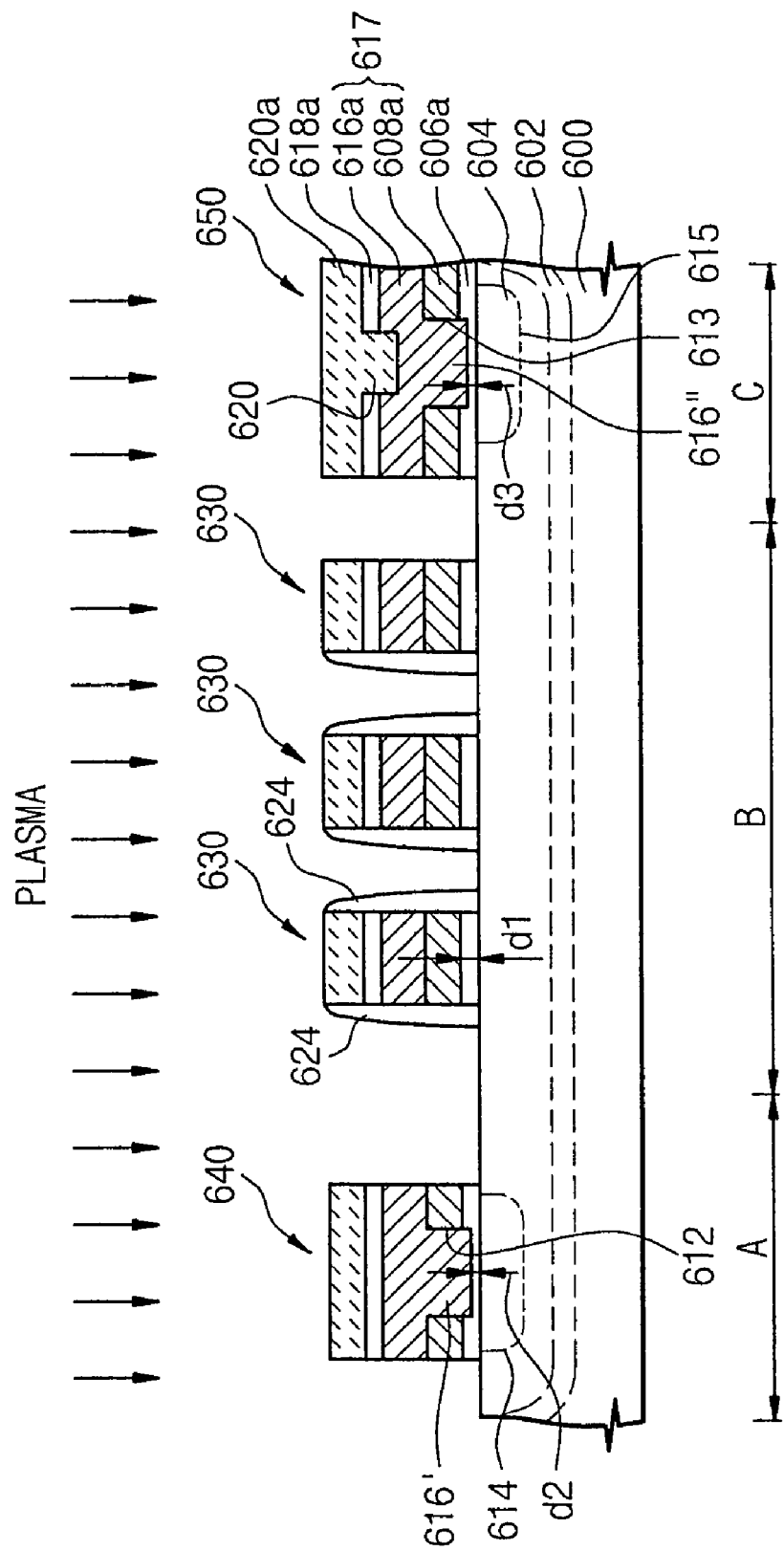
FIGS. 8 through 10 are sectional views taken along line I-I' of FIG. 6, illustrating a method for fabricating the nonvolatile memory device according to an alternative exemplary disclosed embodiment.
Figure 9A:
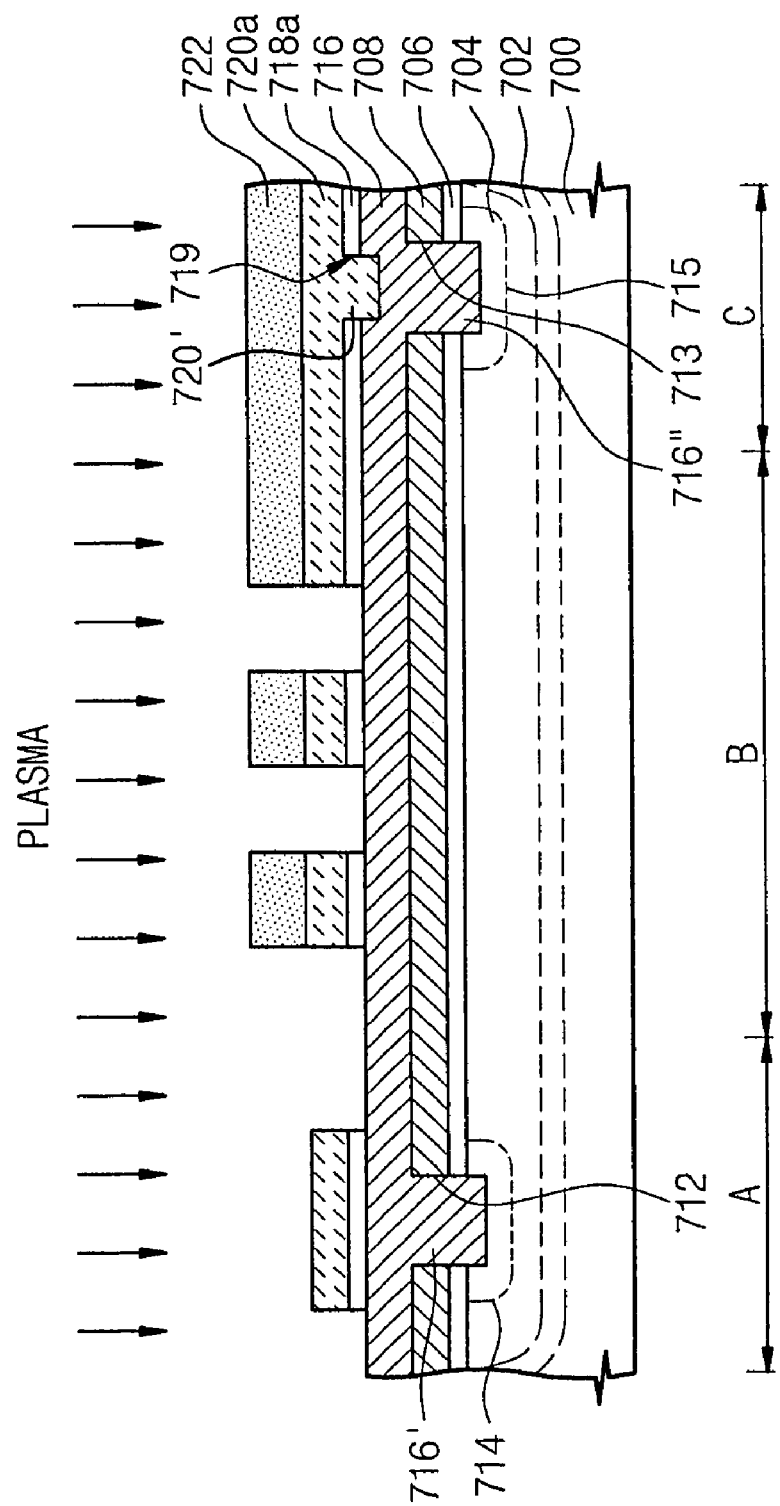
Figure 10:
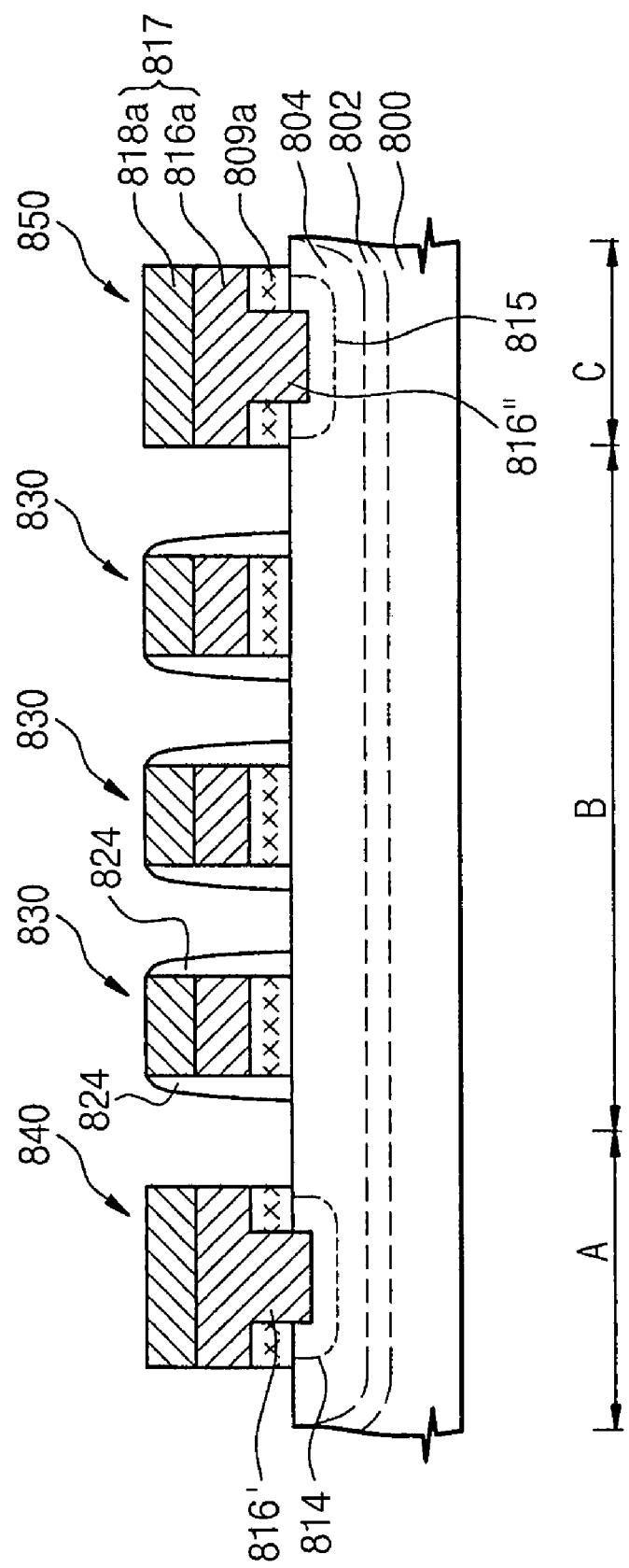

FIGS. 8 through 10 are sectional views taken along line I-I' of FIG. 6, illustrating alternative exemplary embodiments of the method for fabricating the nonvolatile memory device, that are similar to the exemplary embodiments discussed above. Therefore, features similar to those discussed above will be described briefly or omitted herein, but dissimilar features may be focused on in the following description.

Referring to FIG. 8, a first butting contact 616' and a second butting contact 616" are formed in the first and second dummy pattern regions A and C, respectively. In addition, a third butting contact 620' is formed in the second dummy pattern region C for electrically connecting a control gate 620a to a floating gate 617. Moreover, a heavily doped first p-well 614 is formed in a substrate 600 under the first butting contact 616', and a heavily doped second p-well 615 is also formed in the substrate 600 under the second butting contact 616".

Similarly to FIGS. 3A and 3B, a thickness d2 of the tunnel dielectric layer 606a in the first dummy pattern region A and a thickness d3 of the tunnel dielectric layer 606a in the second dummy pattern region C are smaller than a thickness d1 of the tunnel dielectric layer 606a. That is, only a portion of the tunnel dielectric layer 606a is etched when forming the first and second contact holes 612 and 613. In an exemplary embodiment, the thickness d2 of the tunnel dielectric layer 606a under the first contact hole 612 may be equal to the thickness d3 of the tunnel dielectric layer 606a under the second contact hole 613. Furthermore, the thicknesses d1 and d3 are sufficiently small such that the plasma charges are easily tunneled during the plasma dry etching for gate patterning.

In an alternative exemplary embodiment, as shown in FIGS. 9A and 9B, only a trench 712a remains in the first dummy pattern region A. Furthermore, similar to FIGS. 4A and 4B, a dummy pattern 750 having no electrical effect is formed in the second dummy pattern region C.

Referring to FIG. 9A, a first butting contact 716' is formed in the first dummy pattern region A, and second and third butting contacts 716" and 720' are formed in the second dummy pattern region C. Furthermore, a plasma dry etching process for gate patterning is performed using a photoresist pattern 722. Furthermore, the photoresist pattern 722, which acts as a mask, exposes the first dummy pattern region A. In addition, plasma charges are accumulated in the second and first conductive layers 716 and 708, and are discharged into the substrate 700 through the first butting contact 716'. Moreover, the plasma charges are discharged into the substrate 700 through the third and second butting contacts 720' and 716".

FIG. 10 illustrates another alternative exemplary embodiment for fabricating a memory device. Specifically referring to FIG. 10, this exemplary embodiment relates to the method for fabricating a SONOS memory device similar to FIGS. 5A through 5D. In particular, a first dummy pattern 840 is formed in the first dummy pattern region A for discharging plasma charges into a substrate 800 during the gate patterning. After the gate patterning, a second dummy pattern 850 is formed in the second dummy pattern region C for discharging the plasma charges into the substrate 800. In addition, a first butting contact 816' is formed to electrically connect a gate electrode 817 to the substrate 800, and a second butting contact 816" is also formed to electrically connect the gate electrode 817 to the substrate 800. In addition, a word line 830 is formed, which is configured with an ONO layer 809a, a gate electrode 817 and a spacer 824.

The above disclosed methods to form semiconductor memory devices may be used to fabricate any type or memory device. As described above, the disclosed methods and structures may minimize the effect caused by plasma damage. Furthermore, as also described above, a butting contact is disposed in the vicinity of the cell array to electrically connect the floating gate to the substrate. Thus, charge build-up of the etching process is improved until the floating gate is completely etched by the patterning process of the word line. Furthermore, by discharging charges from the gates to the substrate, any damage of the tunnel oxide layer may be minimized. These and other such features may enhance the reliability of the memory device.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A nonvolatile memory device, comprising:
   a substrate including a cell array region, a first dummy pattern region and a second dummy pattern region;
   a word line extending lengthwise in a first direction in the cell array region, and including a first insulating layer and a first conductive layer;
   a first dummy pattern formed in the first dummy pattern region, the first dummy pattern extending lengthwise parallel to the first direction and including the first insulating layer, the first conductive layer and a first butting contact formed from a portion of the first conductive layer, wherein the first butting contact provides an electrical connection path connecting the first conductive layer to the substrate; and
   a second dummy pattern formed in the second dummy pattern region, the second dummy pattern extending lengthwise perpendicular to the first direction and including the first insulating layer, the first conductive layer and a second butting contact formed from a portion of the first conductive layer, wherein the second butting contact provides an electrical connection path connecting the first conductive layer to the substrate.

2. The nonvolatile memory device of claim 1, wherein the first butting contact is one of a first contact directly contacting the substrate and a second contact not directly contacting the substrate and including a tunnel which runs through the first conductive layer and the substrate.

3. The nonvolatile memory device of claim 2, wherein the thickness of the first insulating layer interposed between the second contact and the substrate in the first dummy pattern region is smaller than the thickness of the first insulating layer in the cell array region.

4. The nonvolatile memory device of claim 1, wherein the substrate includes a first well electrically connected to the first butting contact, and the first well has a higher impurity concentration than the substrate.

5. The nonvolatile memory device of claim 1, wherein the second butting contact is one of a third contact directly contacting the substrate and a fourth contact not directly contacting the substrate and including a tunnel running through the first conductive layer and the substrate.

6. The nonvolatile memory device of claim 5, wherein the thickness of the first insulating layer formed in the second dummy pattern region and interposed between the fourth contact and the substrate is smaller than the thickness of the first insulating layer formed in the cell array region.

7. The nonvolatile memory device of claim 1, wherein the substrate including a second well electrically connected the second butting contact, and the second well has a higher impurity concentration than the substrate.

8. The nonvolatile memory device of claim 1, wherein the first insulating layer has a structure in which a first dielectric layer and a charge storage layer are stacked in sequence.

9. The nonvolatile memory device of claim 6, wherein the word line further comprises a second insulating layer and a second conductive layer which are stacked on the first conductive layer, and
   the second dummy pattern further comprises the second insulating layer, the second conductive layer, and a third butting contact formed from a portion of the second conductive layer, the third butting contact providing an electrical connection path connecting the second conductive layer to the first conductive layer.

10. A nonvolatile memory device, comprising:
    a substrate including a cell array region, a first dummy pattern region and a second dummy pattern region;
    a word line extending lengthwise in a first direction in the cell array region, and including a first insulating layer and a first conductive layer; and
    a trench formed by removing a portion of the substrate in the first dummy pattern region, and extending lengthwise in a direction parallel to the first direction,
    a dummy pattern formed in the second dummy pattern region and extending lengthwise in a direction perpendicular to the first direction, and including the first insulating layer, the first conductive layer, and a first butting contact providing an electrical connection path connecting the first conductive layer to the substrate.

11. The nonvolatile memory device of claim 10, wherein the word line further includes a second insulating layer and a second conductive layer stacked on the first conductive layer, and
    the second dummy pattern further comprises the second insulating layer, the second conductive layer, and a third butting contact formed from a portion of the second conductive layer, the third butting contact providing an electrical connection path connecting the second conductive layer to the first conductive layer.

* * * * *